United States Patent
Osman et al.

(10) Patent No.: US 7,755,443 B2
(45) Date of Patent: Jul. 13, 2010

(54) DELAY-BASED MODULATION OF RF COMMUNICATIONS SIGNALS

(75) Inventors: Saleh Osman, Cupertino, CA (US); Earl W. McCune, Jr., Santa Clara, CA (US)

(73) Assignee: Panasonic Corporation, Osaka (JP)

( * ) Notice: Subject to any disclaimer, the term of this patent is extended or adjusted under 35 U.S.C. 154(b) by 239 days.

(21) Appl. No.: 12/031,866

(22) Filed: Feb. 15, 2008

(65) Prior Publication Data

US 2009/0207941 A1 Aug. 20, 2009

(51) Int. Cl.
 *H03C 3/00* (2006.01)
(52) U.S. Cl. .................. 332/144; 332/145; 331/17; 375/302
(58) Field of Classification Search ............. 331/17; 332/144, 145; 375/302; 445/110
 See application file for complete search history.

(56) References Cited

U.S. PATENT DOCUMENTS

| | | | |
|---|---|---|---|
| 6,069,537 A * | 5/2000 | Kim et al. | 332/119 |
| 6,160,856 A | 12/2000 | Gershon | |
| 6,204,734 B1 | 3/2001 | Zhang et al. | |
| 6,909,316 B2 | 6/2005 | Owens et al. | |
| 7,298,220 B2 * | 11/2007 | Willis | 331/16 |
| 2003/0169838 A1 * | 9/2003 | Greenstreet et al. | 375/376 |
| 2005/0116786 A1 | 6/2005 | Harron et al. | |

OTHER PUBLICATIONS

W. Sander et al., "Polar Modulator for Multi-mode Cell Phones," Proceedings of the 2003 IEEE Custom Integrated Circuits Conference (CICC 2003), invited paper.

* cited by examiner

*Primary Examiner*—Joseph Chang
*Assistant Examiner*—Jeffrey Shin

(57) ABSTRACT

An apparatus for providing an angle modulated signal includes a tunable oscillator circuit, a variable time delay circuit, and an optional scaling and delay control apparatus. The tunable oscillator circuit generates an oscillatory signal having a predetermined frequency. The variable time delay circuit operates to delay the oscillatory signal in accordance with time varying changes in an angle control signal, thereby producing the desired angle modulated signal. The scaling and delay control apparatus is configured to scale the angle control signal to account for frequency dependent phase delays of the oscillatory signal through the variable time delay circuit. The methods and apparatus of the present invention may be advantageously used in RF transmitters and receivers, such as in a polar transmitter, where the oscillatory signal generated by the tunable oscillator apparatus serves as a carrier signal, and the angle control signal used to control the delay of the variable time delay circuit comprises a phase modulation signal from the phase path of the polar transmitter.

18 Claims, 9 Drawing Sheets

DELAY-BASED MODULATION OF RF COMMUNICATIONS SIGNALS

FIELD OF THE INVENTION

The present invention relates to modulation of signals. More particularly, the present invention relates to delay-based modulation of signals.

BACKGROUND OF THE INVENTION

A voltage controlled oscillator (VCO) is an electrical oscillator that generates an oscillatory signal having a frequency which is dependent on a control voltage. VCOs provide important functions in communication systems and other electronic systems. They are used in both analog and digital systems, and are essential components in virtually every radio frequency (RF) communication system.

FIG. 1 is a schematic drawing of a commonly used VCO 100, as is known in the art. The VCO 100 comprises an inductive-capacitive (L-C) tank circuit 102, first and second cross-coupled transistors 112 and 114, and a current source 116. The tank circuit 102 includes first and second inductors 104 and 106 and first and second varactor diodes 108 and 110. As will be explained in more detail below, the varactor diodes are special types of diodes configured to provide a variable capacitance depending on the voltage applied across their terminals.

The frequency of oscillation of the VCO 100 is determined by the resonant frequency of the tank circuit 102. More specifically, the frequency of oscillation of the VCO 100 is generally determined by the equation: $\omega = 1/\sqrt{LC}$, where L represents the sum of the inductances of the first and second inductors 104, 106, and C represents the capacitance contributed by the first and second varactor diodes 108, 110.

Ideally the tank circuit 102 has zero resistance, and the oscillator 100 oscillates in perpetuity once it is set into oscillation. However, because the capacitors and inductors of the tank circuit 102 are not ideal (they each include some finite amount of resistance), the oscillator 100 cannot continue to oscillate unabated absent some mechanism to counteract the non-idealities. This is the purpose of the first and second cross-coupled transistors 112, 114, which together provide a negative resistance that effectively cancels out loss resistances contributed by the tank circuit components.

VCOs are typically configured within phase-locked loop (PLLs), to counteract a tendency of the output frequency of the VCO to drift. The PLL prevents frequency drift by forcing the VCO to lock to a highly stable reference frequency, e.g., derived from the resonant frequency of mechanical vibration of a crystal, such as quartz. Multiples of the reference frequency can also be generated, by including a frequency divider in the feedback loop of the PLL.

FIG. 2 is a block diagram illustrating the principal elements of a PLL 200. The PLL 200 comprises a phase detector 202, a loop filter 204, a VCO 206, and a frequency divider 208. A first input of the phase detector 202 is configured to receive a reference frequency signal having a precise and stable frequency, $f_{ref}$. A second input of the phase detector 202 is configured to receive a feedback signal having a frequency f/N, where f represents the frequency of the VCO output signal and N is a divisor provided by the frequency divider 208. The frequency divider 208 is controlled by a tuning control signal (labeled "TUNING" in the drawing), which allows the VCO 206 to be tuned to different frequencies, f.

During operation the VCO 206 tunes to frequencies corresponding to voltages of a control signal, Vtune, applied to the VCO's voltage control input. The frequency of the VCO output is divided by the frequency divider circuit 208 to provide a signal having a divided frequency, f/N. This divided frequency signal is applied to the second input of the phase detector 202, while the reference frequency signal is applied to the first input of the phase detector 202. In response to the applied signals, the phase detector 202 generates a semi-periodic phase difference signal (or 'error' signal) if the divided frequency, f/N, deviates from the reference signal frequency, $f_{ref}$. The error signal includes a measure of the degree to which the two frequencies are misaligned. The loop filter 204 filters the error signal, and provides an adjusted control signal, Vtune, having a voltage level that causes the VCO 206 to correct its output frequency in a direction that reduces the frequency misalignment. The corrected VCO output signal is fed back to the frequency divider circuit 208, and the phase detection and error reduction processes described above are repeated until f/N is forced to equal the reference signal frequency $f_{ref}$. When this condition occurs the VCO output frequency, f, is equal to $N \times f_{ref}$ and the PLL 200 is said to be "locked."

PLLs are used in a variety of applications, including frequency synthesis, pulse synchronization of signals from mass storage devices, and regeneration of signals. They are also critical components of RF transmitters and receivers. FIG. 3 illustrates, for example, how a PLL 312 is configured as a phase modulator within a phase path of a polar transmitter 300. The polar transmitter 300 comprises a baseband processor 302; a rectangular-to-polar converter 304; an amplitude path (or 'envelope path') including an envelope path digital-to-analog converter (DAC) 306 and an envelope modulator 308; a phase path including a phase path DAC 310 and the PLL 312; an RF power amplifier (RF PA) 314; and an antenna 316. An output of the envelope modulator 308 in the amplitude path of the transmitter 300 is coupled to a power control input of the RF PA 314, and the output of the PLL 312 is coupled to an RF input of the RF PA 314.

The polar transmitter 300 operates as follows. First, the baseband processor 302 receives a digital message from a digital message source and generates a sequence of in-phase (I-phase) and quadrature-phase (Q-phase) symbols from the digital message according to a predetermined baseband modulation scheme. The rectangular-to-polar converter 304, which typically comprises a Coordinate Rotation Digital Computer (CORDIC) conversion process, converts the rectangular baseband modulated signals, (x, y)=(I, Q), to polar form: $(\rho, \theta) =$ $$\left(\sqrt{I^2 + Q^2}, \tan^{-1}\left(\frac{Q}{I}\right)\right).$$

The resulting envelope and phase component signals are then separately processed in the amplitude and phase paths of the transmitter 300.

In the amplitude path, the envelope path DAC 306 converts the digital envelope component signal into an analog envelope component signal. The analog envelope component signal is used by the envelope modulator 308 to modulate a power supply voltage, Vsupply, according to the shape (i.e., amplitude variations) of the envelope component signal. The modulated power supply voltage signal is applied to the power control input of the RF PA 314. Meanwhile, in the phase path, the phase path DAC 310 operates to convert the phase component signal into an analog phase component signal. The analog phase component signal is applied to the PLL 312, specifically to the phase detector 316 of the PLL 312, to generate a control voltage signal proportional to the phase error between the phase modulation signal and the divided frequency signal from the output of the frequency divider 322. Similar to the description of the PLL 200 in FIG. 2 above, the VCO 320 in the polar transmitter 300 in FIG. 3 responds to the control voltage signal by adjusting its output frequency according to the magnitude of the control signal. When the PLL 312 is locked, the VCO 314 provides a phase modulated output signal, $\cos(\omega_c t+\theta(t))$, where $\omega_c$ represents the carrier frequency (in radians/sec) of the RF carrier signal specified by the tuning command at the tuning input of the frequency divider 322, and $\theta(t)$ represents the phase modulation applied to the carrier signal.

The RF phase modulated signal, $\cos(\omega_c t+\theta(t))$, from the phase path of the polar transmitter 300 is recombined with the envelope information from the amplitude path at the RF PA 314, to provide the desired angle modulated output signal, $A(t)\cos(\omega_c t+\theta(t))$, where $A(t)$ represents the time varying envelope variation imposed on the phase modulated signal, $\cos(\omega_c t+\theta(t))$. The RF PA 314 is usually configured to operate as a switch-mode amplifier. Therefore, the power of the angle modulated RF output signal of the polar modulator 300 is directly controlled by the modulated power supply voltage applied to the power control input of the RF PA 314.

Application of phase modulation to the RF carrier in the manner described above proves to be satisfactory for narrowband applications. However, in wideband applications the effective tuning capability of the VCO is limited by the capacitance versus voltage (CV) characteristics of its varactor diodes. Wideband applications require the varactor diodes to be operated over a wider voltage range than in narrowband applications. However, the varactor diode capacitances relate linearly to the voltage applied across them, Vtune, only over a narrow voltage range (see FIG. 4). This linear tuning range is only on the order of about a diode drop (i.e., 0.7 V).

The nonlinear CV relationship of the VCO varactor diodes outside the linear range results in a tuning sensitivity, $K_v$, which varies depending on what the value of the control signal, Vtune, is. This variation in $K_v$ leads to nonlinear operation of the VCO, which is a highly undesirable condition since the nonlinearities cause PM-PM distortion (i.e., phase modulation errors caused by an output relating nonlinearly to its input) in the desired final phase modulated output signal. There are prior art techniques that can be used to limit the effects of variations in tuning sensitivity, $K_v$. However, those techniques result in a wide variation in loop settling times, which effectively limits the tuning bandwidth capability of the VCO and PLL.

Wide bandwidth and fast, well-controlled settling time capabilities are needed to generate and process the types of waveforms used in current and next generation wireless communications standards. The waveform types used in third generation (3G) cellular systems (e.g., signals used in Wideband Code Division Multiple Access (W-CDMA) systems and according to the High-Speed Downlink Packet Access (HSDPA) protocol), and other high data rate and next-generation cellular systems communication systems can exhibit considerable signal activity in the vicinity of the origin of the signal plane. The time rate of change of the phase of these signals can also be quite high. In extreme circumstances in which the signal passes through the origin, an instantaneous phase reversal corresponding to an essentially infinite time rate of change of the signal phase can occur. Unfortunately, accurately and precisely producing waveforms having these characteristics using the prior art tunable VCO/PLL apparatus described above is difficult or even impossible to achieve due to the limited linear tuning range capability of the VCO and PLL.

Considering the foregoing limitations and problems of the prior art, therefore, it would be desirable to have wideband phase modulation methods and apparatus which avoid signal distortions caused by nonlinear VCO operation.

SUMMARY OF THE INVENTION

Methods and apparatus for performing angle modulation using a variable time delay control are disclosed. An exemplary angle modulator apparatus includes a tunable oscillator circuit and a variable time delay circuit. The tunable oscillator circuit is configured to generate an oscillatory signal having a frequency determined by a frequency tuning command. The variable time delay circuit has a first input configured to receive the oscillatory signal and a delay control input configured to receive a delay control signal. The delay control signal (or "angle control signal") can be viewed as an angle modulation signal, which the variable time delay circuit responds to, to generate the desired angle modulated output signal.

According to one aspect of the invention, a scaling and delay control apparatus is configured to scale the angle control signal before the angle control signal is applied to the delay control input of the variable time delay circuit. The scaling is performed so that the resulting scaled angle control signal is inversely proportional to the frequency of the oscillatory signal. In this manner, frequency dependent delays of the oscillatory signal through the variable time delay circuit are accounted for.

The delay-based modulation methods and apparatus of the present invention may be advantageously employed in RF transmitters and receivers. According to one embodiment of the invention, an RF oscillatory signal generated by a tunable oscillator apparatus serves as an RF carrier signal in a polar transmitter apparatus and the angle control signal used to control the delay of a variable time delay circuit comprises a phase modulation signal from the phase path of the polar transmitter. Because the phase modulation is applied to the carrier signal using the variable time delay circuit, rather than by modulating the oscillator by a phase difference signal to generate the desired phase modulation (as is done in prior art approaches), the required loop bandwidth of the phase-locked loop (PLL) (or frequency-locked loop (FLL)) in which the oscillator is configured is relaxed, and oscillator nonlinearities caused by variations in loop bandwidth are avoided. To account for frequency dependent phase delays through the variable time delay circuit, a scaling and delay control apparatus may also be configured within the phase path of the polar transmitter.

Other features and advantages of the present invention will be understood upon reading and understanding the detailed description of the preferred exemplary embodiments, found hereinbelow, in conjunction with reference to the drawings, a brief description of which are provided below.

DETAILED DESCRIPTION

Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

Figure 1:
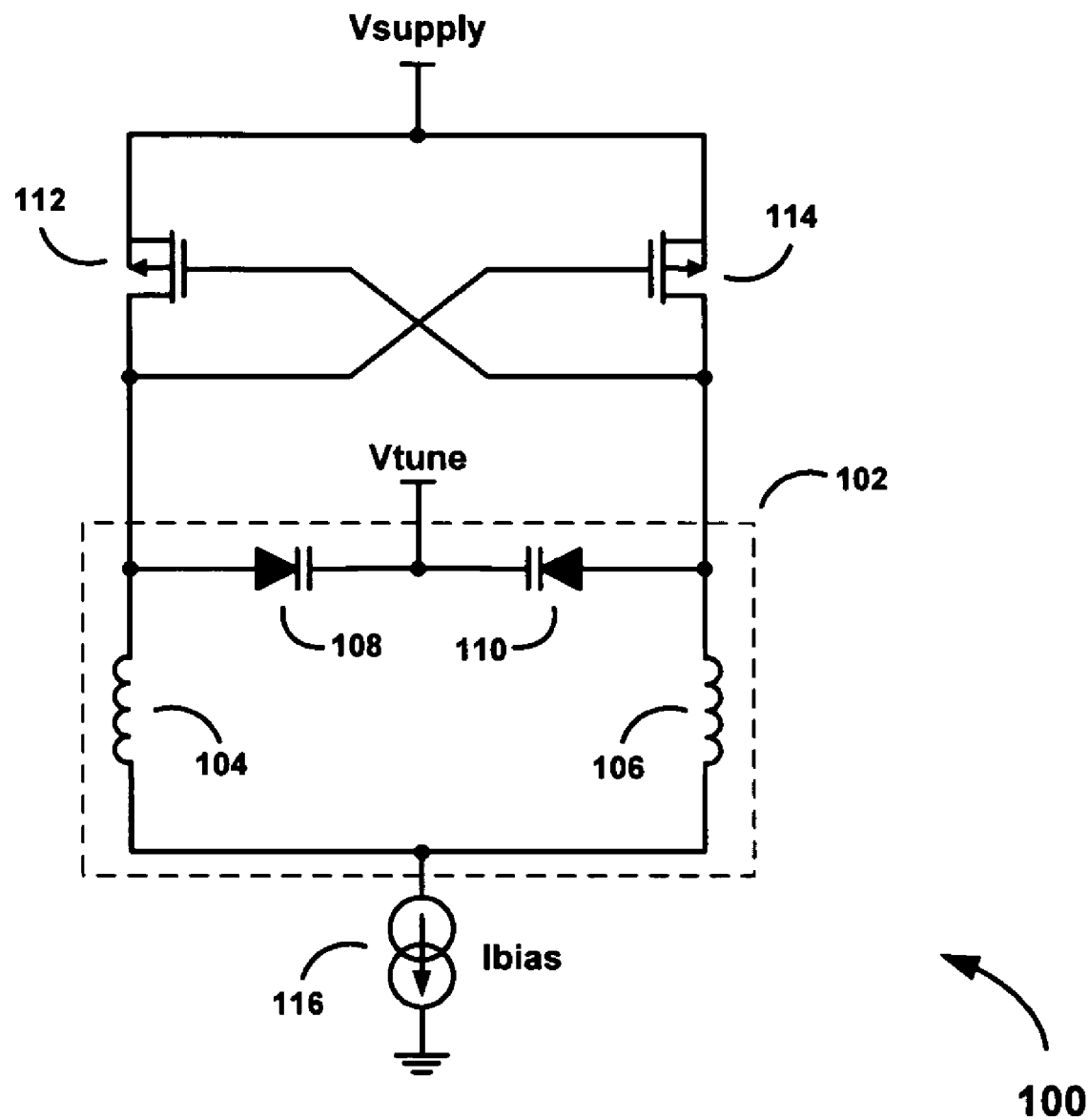
FIG. 1 is a schematic diagram of a commonly used voltage controlled oscillator (VCO)
Figure 2:
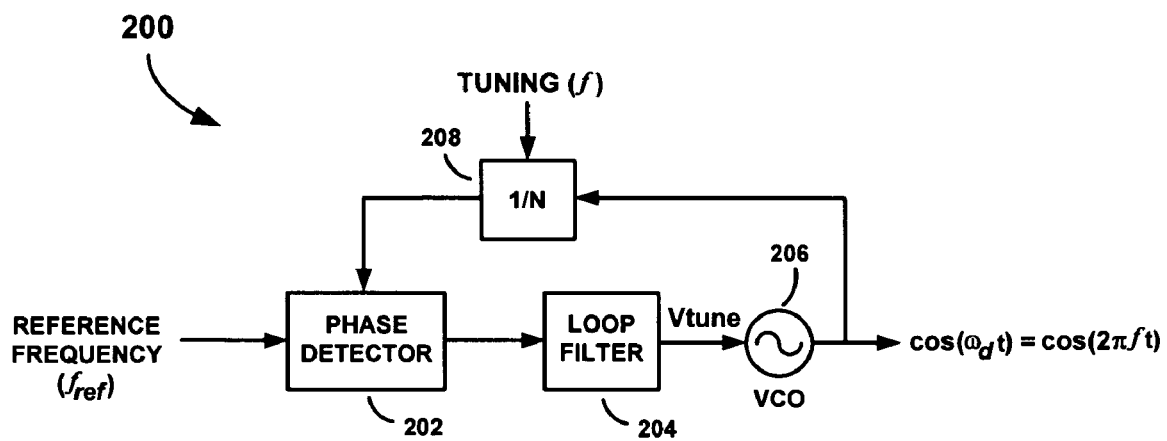
FIG. 2 is a block diagram of a typical phase-locked loop (PLL)
Figure 3:
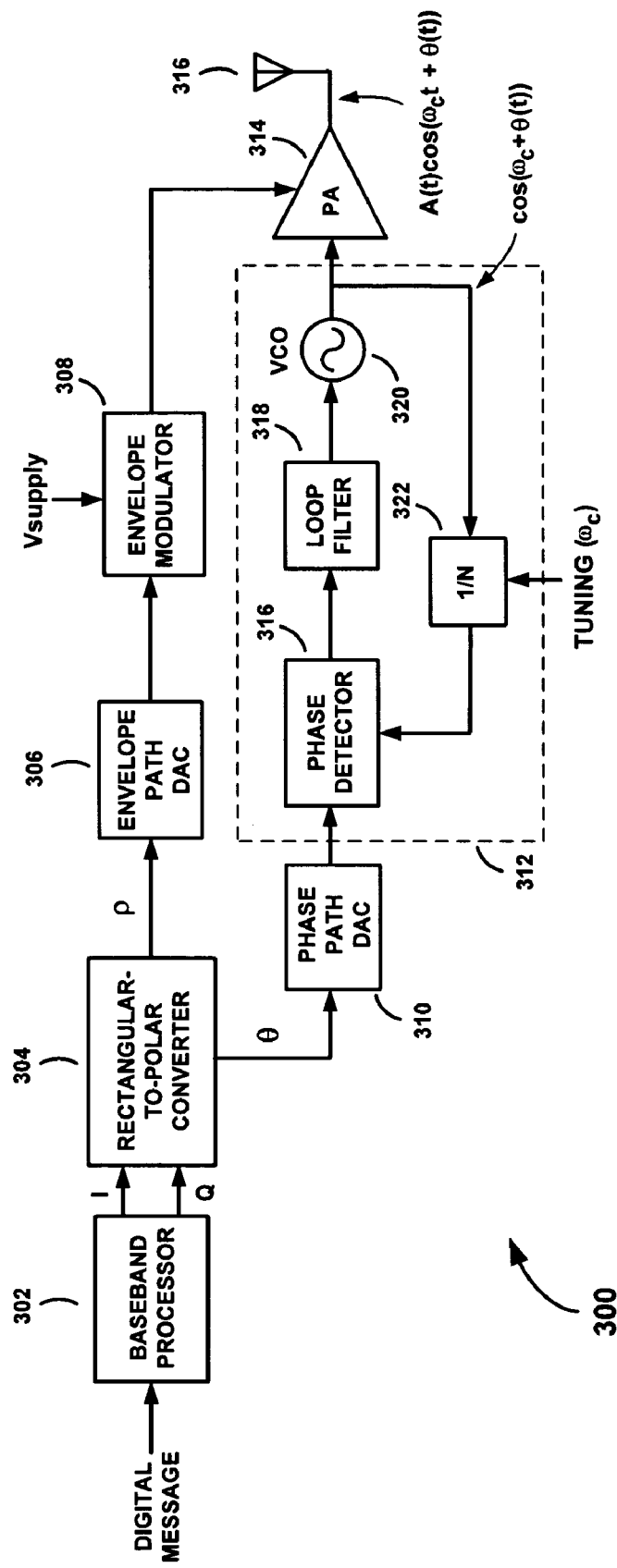
FIG. 3 is a block diagram a polar transmitter, illustrating how a PLL is configured within a phase path of the polar transmitter.
Figure 4:
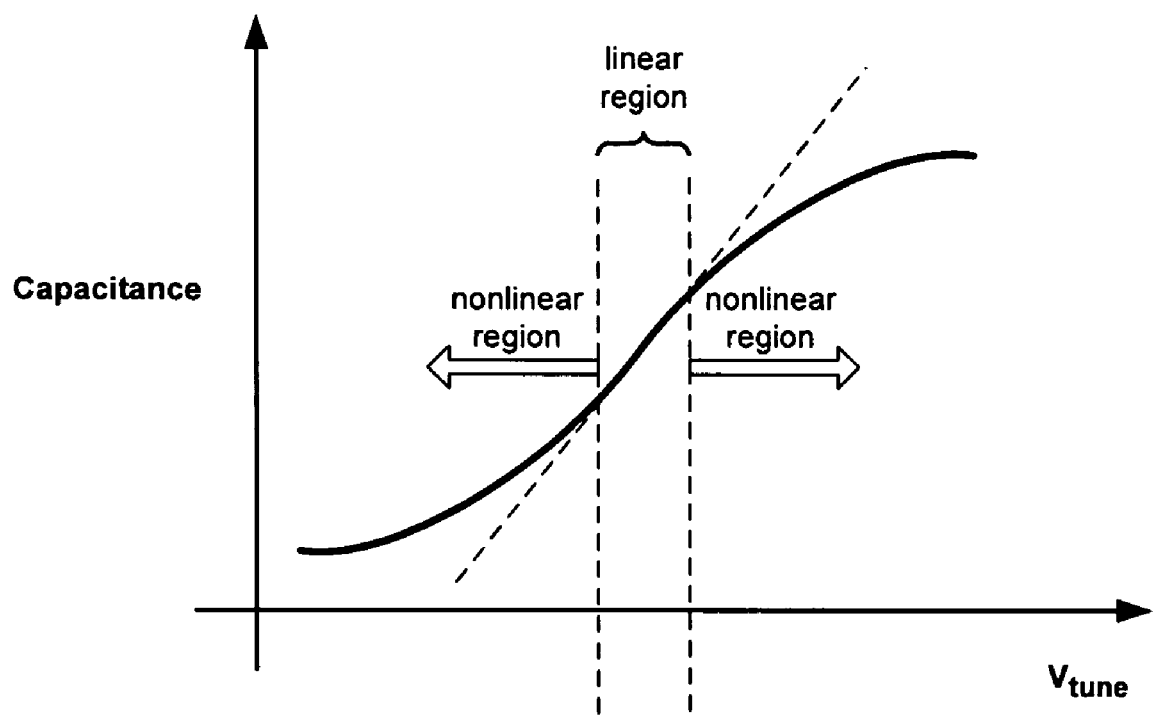
FIG. 4 is a simplified capacitance versus voltage diagram illustrating how the collective capacitance of the varactor diodes in a VCO varies as a function of applied voltage.
Figure 5:
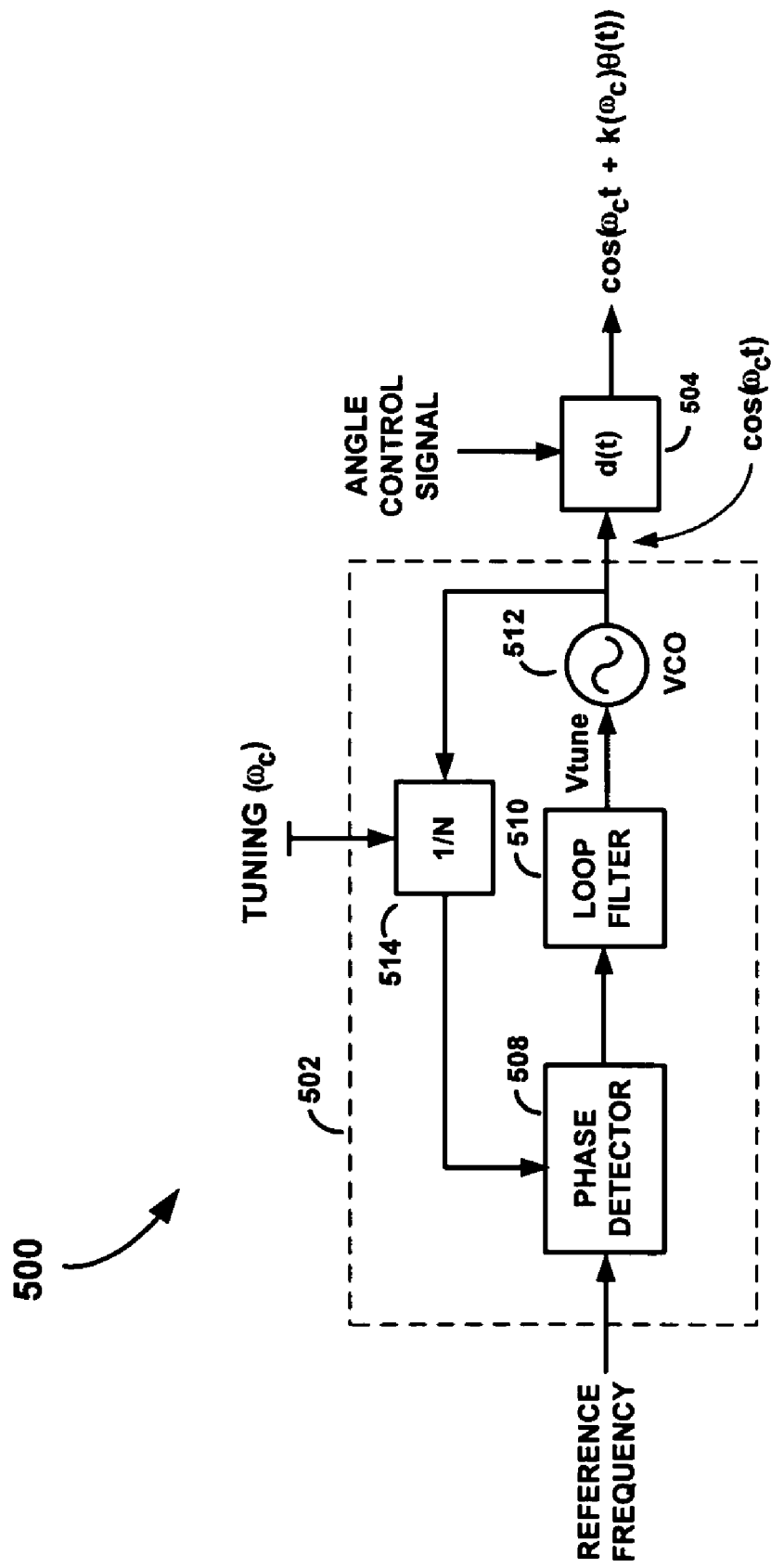
FIG. 5 is a block diagram of an angle modulator apparatus, according to an embodiment of the present invention.

Referring first to FIG. 5, there is shown a block diagram of an angle modulator apparatus 500, according to an embodiment of the present invention. The angle modulator apparatus 500 comprises a phase-locked loop (PLL) 502 and a variable time delay circuit 504. The PLL 502 includes a phase detector 508, a loop filter 510, a VCO 512 and a feedback loop containing a frequency divider 514. The variable time delay circuit 504 has a first input configured to receive a carrier signal, $\cos(\omega_c t)$, from the VCO 512 of the PLL 502. The PLL 502 operates similar to that described above, except that the VCO 512 is not modulated to apply modulation to the carrier signal, $\cos(\omega_c t)$. Instead, modulation is applied to the carrier signal by directing the carrier signal through the variable time delay circuit 504 and variably delaying the carrier signal according to time varying changes in angle of the angle control signal. In other words, the amount of delay imparted to the carrier signal, $\cos(\omega_c t)$, and hence the angle modulation applied to the carrier signal, is determined by angle information contained in the angle control signal applied to the variable time delay circuit 504.

Figure 6:
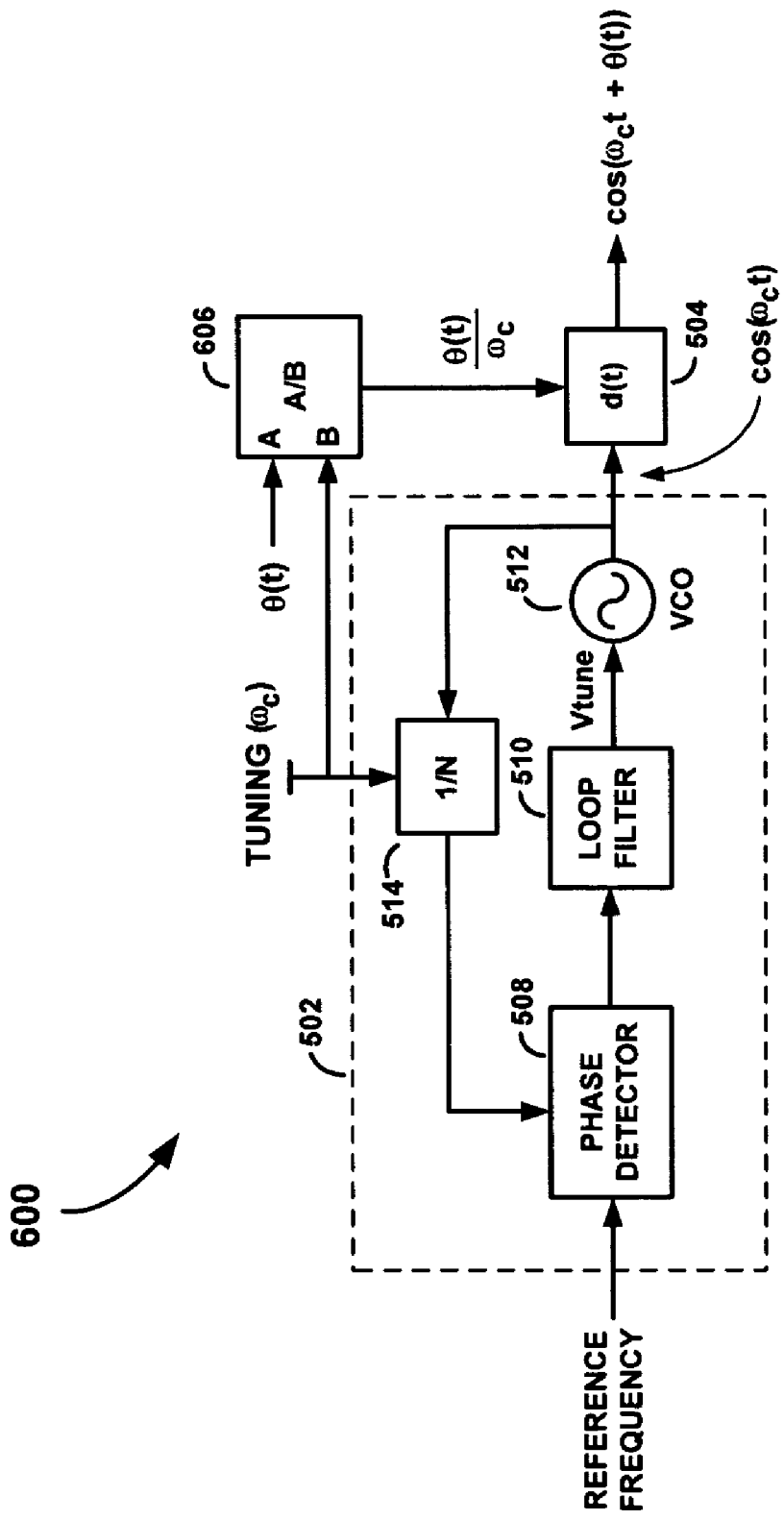
FIG. 6 is a block diagram of an angle modulator apparatus that includes a scaling and delay control apparatus, according to an embodiment of the present invention.

According to one aspect of the invention the angle modulator apparatus 500 is configured to generate a phase modulated signal. The actual amount of phase modulation corresponding to any particular delay through the variable delay circuit 504 is strongly dependent on the carrier signal frequency, $\omega_c$, due to a phenomenon known as "phase delay." To account for this dependency a scaling and delay control circuit 606 is employed, as illustrated in FIG. 6. The scaling and delay control apparatus 606 operates to scale the angle control signal (i.e., 'phase control signal' or 'phase modulation signal,' $\theta(t)$) before it is applied to the delay control input of the variable time delay circuit 504. According to one aspect of the invention, the scaling factor is inversely proportional to the carrier signal frequency, $\omega_c$ (as indicated by the scaled angle control signal, $\theta(t)/\omega_c$, in the drawing). By scaling the phase control signal, $\theta(t)$, in this manner the product of the carrier signal frequency and the phase delay results in the desired phase modulated output signal, $\cos(\omega_c t + \theta(t))$.

One significant advantage of using the angle modulator apparatus as a phase modulator apparatus is that there is no need to modulate the VCO with a phase differential signal, as is required in prior art polar transmitter approaches. Specifically, in prior art approaches the time derivative of the phase, i.e., $d\theta(t)/dt$, must be applied to the VCO in order to generate the desired phase modulated signal. The reason for this is that a VCO integrates signals applied to its input. Unfortunately, because $d\theta(t)/dt$ typically has more abrupt time variations than the phase, $\theta(t)$, the desired linear response of the VCO is strained by the wide range in frequencies characterizing the abrupt time variations. By contrast, the VCO in the angle modulator apparatus 500 in FIG. 5 is not modulated to apply the phase modulation; so there is no need to use $d\theta(t)/dt$ to control the phase modulation. Consequently, the required loop bandwidth of the PLL is relaxed and VCO nonlinearities caused by variations in loop bandwidth are avoided. Avoiding VCO nonlinearities affords the ability to apply wideband phase modulation to carrier signals in RF transmitters, particularly in polar transmitters, which, depending on the application, often require generation of phase modulated signals over a wide dynamic range.

While the angle modulator apparatus 500 has been shown and described as employing a voltage controlled oscillator and a phase-locked loop, those of ordinary skill in the art will readily appreciate and understand that other mechanisms for providing the oscillating signal, besides a VCO and PLL, may by used. For example, oscillators that are controlled by a current signal, rather than by a voltage signal may alternatively be used. Also, frequency-locked loops (FLLs), rather than PLLs, and/or digitally controlled oscillators may alternatively be used. Still further, while the exemplary embodiments have been described in the context of integer multiple frequency PLLs, those of ordinary skill in the art will understand that the inventive concepts of the present invention may also be applied in the context of fractional-N frequency synthesis.

Figure 7:
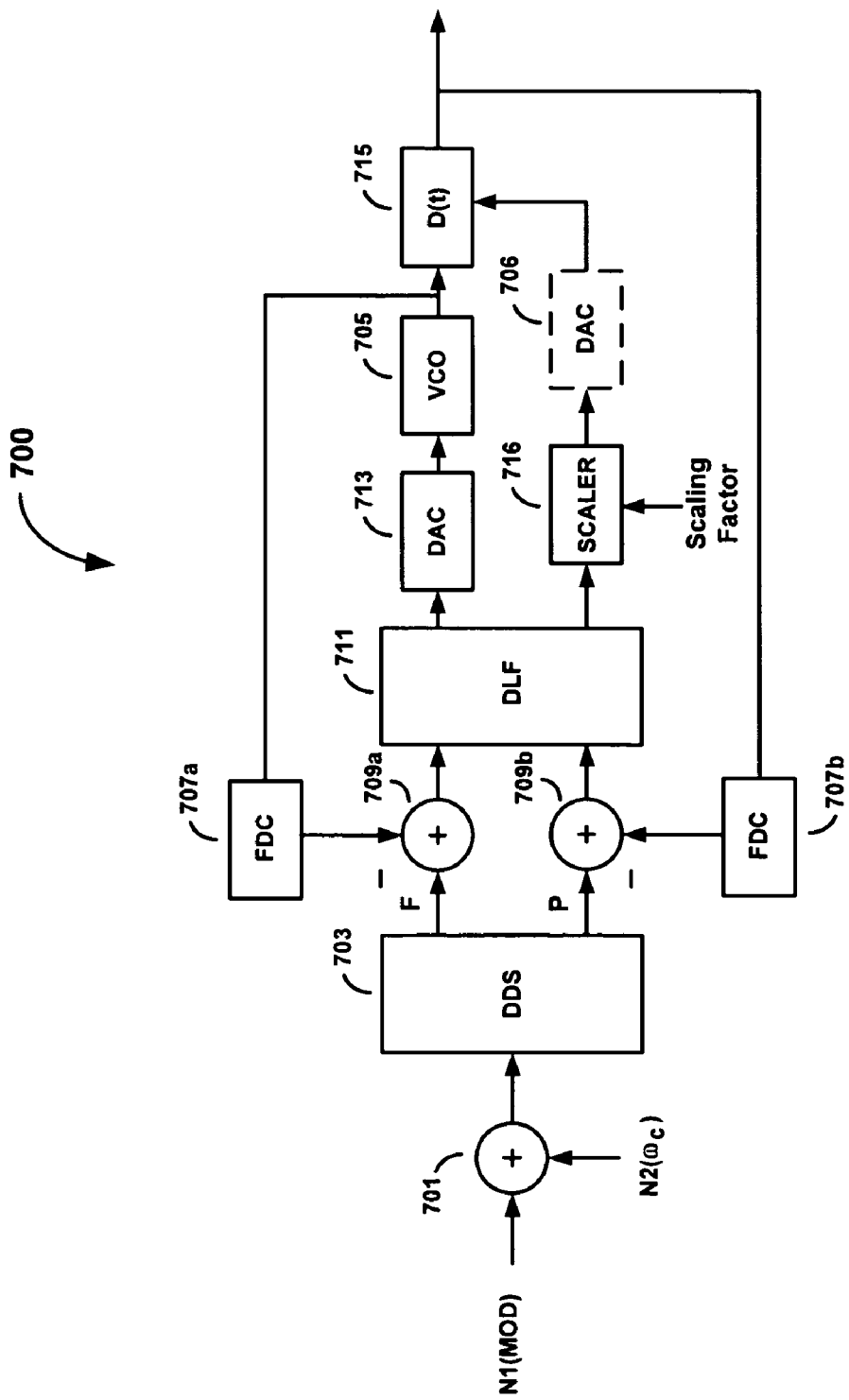
FIG. 7 is a block diagram of a digital implementation of an angle modulator apparatus, according to an embodiment of the present invention.

Referring now to FIG. 7 there is shown a block diagram of an angle modulator apparatus 700, according to another embodiment of the present invention. This angle modulator apparatus 700 is similar to the angle modulator apparatus 500 in FIG. 5, except that it is a mostly digital implementation. A digital frequency reference signal N2 is applied to a first adder 701 together with a digital modulation phase difference signal N1. The resulting sum is applied to a direct digital frequency synthesizer (DDS) 703. The DDS 703 outputs a stream of bits 'F' representing a desired operating frequency of a VCO 705, an output signal of which is input to a first sigma-delta Frequency-to-Digital Converter (FDC) 707a. The output signals of the first FDC 707a and the DDS 703 are similar to the output signal of a sigma-delta modulator in the sense that pulse density is used to represent frequency. Hence, the DDS 703 in particular does not output a sinusoidal signal, but rather a pulse-density signal representing a sinusoidal signal.

The frequency reference signal N2 represents the center carrier frequency of the VCO 705 for a particular communications channel. The modulation phase difference signal N1 is a sample-time by sample-time change in the desired phase of the modulated signal, and is phase accurate in the sense that if it were accumulated it would represent actual phase. The phase difference is actually a frequency. Therefore, the present loop is actually a frequency locked loop (FLL), although the phase-accurate properties of the loop are more typical of a phase locked loop (PLL).

A second adder 709a forms a difference between the output signal 'F' of the DDS 703 and the output signal of the first FDC 707a to form an error signal (also a stream of bits). The first FDC 707a provides a conversion output that is decimated down to the digital loop clock rate. The DDS 703 takes the desired "frequency" and generates a digital stream much like the digital portion of a sigma-delta analog-to-digital converter with an output resolution to match the FDC decimator at the loop clock frequency. Hence, if the VCO 705 is at the desired frequency then the first FDC 707a and the DDS 703 (on the output F) will be outputting the same average values, and if the VCO 705 is not at the desired frequency, then there will be an error from the second adder 709a. The error signal is filtered by a digital loop filter (DLF) 711 and converted to an analog signal by a DAC 713. Finally, the analog signal is applied to the VCO 705 to control the instantaneous frequency of the VCO 705.

Phase modulation is applied to the output signal of the VCO 705 using a controlled delay circuit 715, similar to as described above. By applying the phase modulation subsequent to the VCO 705 instead of prior to the VCO 705, the bandwidth of the VCO tuning signal is reduced.

Control for the variable delay circuit 715 may be provided in similar manner as control for the VCO 705. In the illustrated exemplary embodiment, an output signal of the variable delay circuit 715 is applied to a second FDC 707b. A third adder 709b forms a difference between an output signal of the second FDC 707b and a desired phase signal 'P' produced by the DDS 703. A resulting phase error signal is filtered by the DLF 711 to produce a digital control signal for the variable delay circuit 715. Optionally, depending on the construction of the variable delay circuit 715, the control signal may be converted to analog form using a DAC 706. Finally, a scaler 716 can be used to apply a scaling factor to the control signal, similar to as described above, to account for frequency dependent delays through the variable delay circuit 715.

Figure 8:
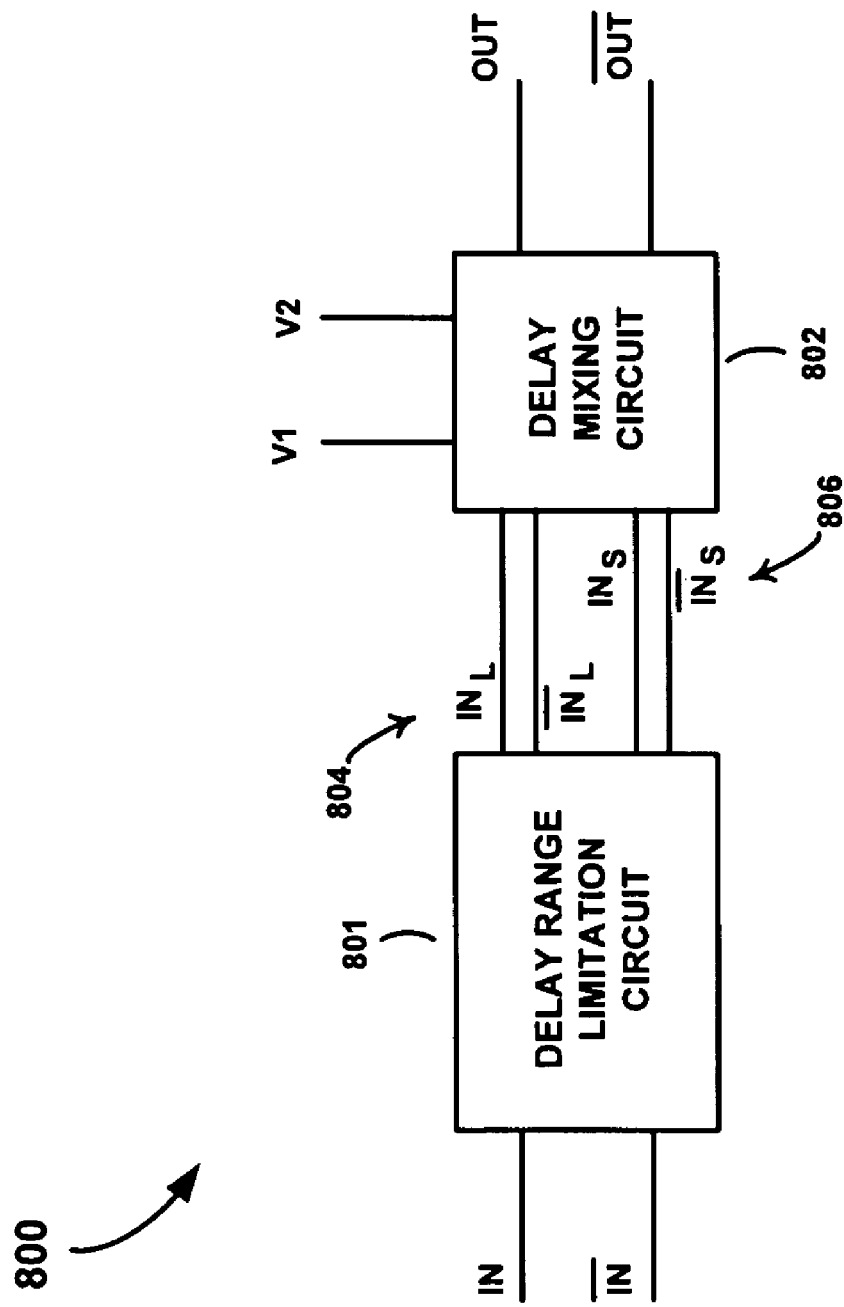
FIG. 8 is a block diagram of a variable delay circuit that may be used in the various angle modulator and polar transmitter apparatuses of the present invention.

The variable time delay circuits of the angle modulator apparatuses 500 and 600 in FIGS. 5 and 6, as well as the variable time delay circuits used in other embodiments of the invention, may be implemented in various ways, digital or analog, and including, for example, use of a cascade of inverter gates or other circuit elements, a phase comparator type circuit, as will be appreciated and understood by those of ordinary skill in the art. Further, the delay circuits may be implemented so that they are either controlled by digital or analog signals. FIG. 5 of U.S. Pat. No. 6,909,316 to Owens et al., which is hereby incorporated by reference, illustrates one variable time delay circuit which can be used to provide the variable time delay of the variable time delay circuits in the various embodiment of the present invention. The variable delay circuit 800, which is shown in FIG. 8 here, comprises a delay range limitation circuit 801 and a delay mixing circuit 802. The delay range limitation circuit 801 is configured to receive a differential analog input signal IN, $\overline{IN}$, and produce a pair of differential output signals, $IN_L$, $\overline{IN}_L$ 804 and $IN_S$, $\overline{IN}_S$ 806. One pair of the differential output signals, namely $IN_L$, $\overline{IN}_L$, is delayed by a maximum delay amount, while the other pair, $IN_S$, $\overline{IN}_S$ 806, is delayed by a minimum delay amount (which may be zero). The two pairs of differential signals, $IN_L$, $\overline{IN}_L$ 804 and $IN_S$, $\overline{IN}_S$ 806, may be produced using chains of analog buffer circuits, for example. The delay mixing circuit 802 forms a delayed differential output signal, OUT, $\overline{OUT}$, by mixing a combination of the maximum and minimum delayed waveforms, $IN_L$, $\overline{IN}_L$ 804 and $IN_S$, $\overline{IN}_S$ 806, according to control voltages V1 and V2. The control voltages may be produced using a special-purpose DAC in which selected binary-weighted currents are transferred to respective voltage pull-up circuits.

Figure 9:
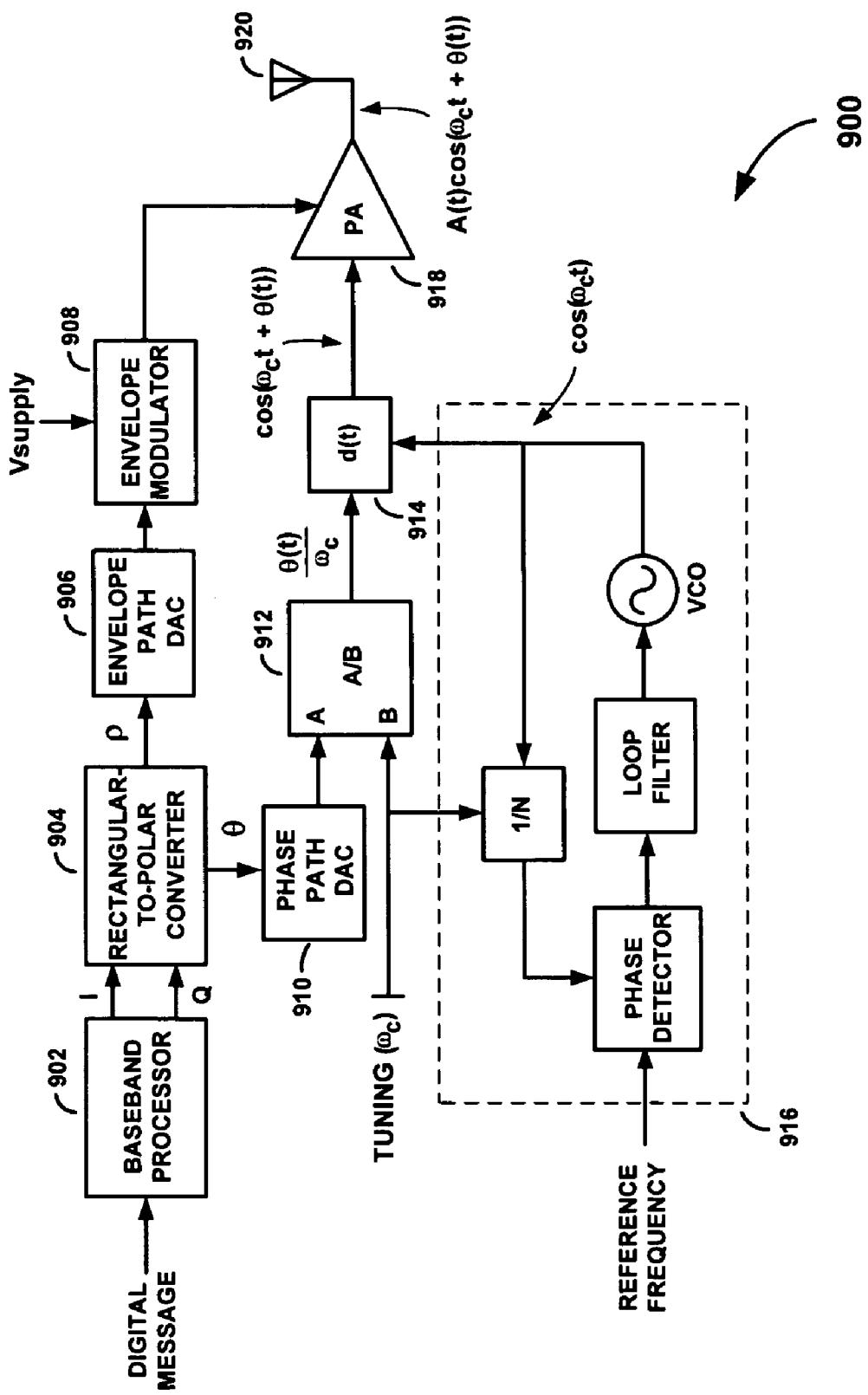
FIG. 9 is a block diagram of a polar transmitter configured to use a delay-based phase modulator similar to the delay-based phase modulator in FIG. 6, according to an embodiment of the present invention.

The angle modulator apparatuses in FIGS. 5-7 and the functions they perform can be employed in any application that utilizes or requires an angle modulated signal. They may be particularly and advantageously employed in RF transmitters and receivers configured to generate and process wideband angle modulated signals. FIG. 9 illustrates, for example, how the angle modulator apparatus in FIG. 6 may be used to generate and provide an RF phase modulated signal in a polar transmitter 900. According to this embodiment of the invention, the polar transmitter 900 comprises a baseband processor 902; a rectangular-to-polar converter 904; an envelope path including an envelope path digital-to-analog converter (DAC) 906 and an envelope modulator 908; a phase path including a phase path DAC 910, scaling and delay control apparatus 912 and variable time delay circuit 914; a PLL 916; an RF PA 918; and an antenna 920.

The baseband processor 902 and rectangular-to-polar converter 904 operate to generate envelope and phase component signals (also referred to herein as "envelope modulation" or "phase modulation" signals). The envelope and phase component signals are then separately processed in the envelope and phase paths of the transmitter 900. In the envelope path, the envelope path DAC 906 converts the envelope component signal into an analog envelope component signal. The analog envelope component signal is used by the envelope modulator 908 to modulate a power supply voltage, Vsupply, according to amplitude variations in the envelope of the envelope component signal. The resulting envelope modulated power supply voltage signal is applied to a power control input of the RF PA 918.

Meanwhile, in the phase path, the phase path DAC 910 operates to convert the phase component signal generated by the rectangular-to-polar converter 904 into an analog phase component signal. An RF carrier signal provided by the PLL 916 is coupled to a first input of the variable time delay circuit 914. The phase component signal in the phase path of the polar transmitter 900 is scaled by the scaling and delay control apparatus 912 to address frequency dependent delays through the variable time delay circuit 914, and then coupled to a second input of the variable time delay circuit 914. The scaled phase component signal is used to variably delay the RF carrier signal passing through the variable time delay circuit 914, according variations in the phase of the phase component signal, thereby generating a phase modulated RF carrier signal, $\cos(\omega_c t + \theta(t))$.

The envelope information from the envelope path of the transmitter 900 is impressed back onto the RF phase modulated signal, $\cos(\omega_c t + \theta(t))$, at the RF PA 918. According to one embodiment of the invention, the RF PA 918 is configured to operate as a switch-mode amplifier. Accordingly, the output of the RF PA 918 comprises an angle modulated signal, $A(t)\cos(\omega_c t + \theta(t))$, where A(t) represents the time varying envelope variation impressed on the phase modulated signal, $\cos(\omega_c t + \theta(t))$, by the envelope modulated power supply signal. The final angle modulated signal, $A(t)\cos(\omega_c t + \theta(t))$, is then coupled to the transmitter antenna 920 for transmission over the air to a remote receiver.

Although the present invention has been described with reference to specific embodiments thereof, these embodiments are merely illustrative, and not restrictive, of the present invention. Various other modifications or changes to the specifically disclosed exemplary embodiments will be suggested to persons skilled in the art and are to be included within the spirit and purview of the appended claims.

What is claimed is:

1. A modulator apparatus comprising:
a tunable oscillator circuit having a tuning command input and an output, the tunable oscillator circuit operable to generate an oscillatory signal having a frequency determined by a frequency tuning command applied to the tuning command input;
a variable time delay circuit having a first input configured to receive the oscillatory signal from said tunable oscillator circuit and a delay control input, the variable time delay circuit operable to variably delay the oscillatory signal according to a delay control signal applied to the delay control input to generate a modulated output signal, said delay control signal comprises a phase modulation signal and the modulated signal generated by said variable time delay circuit comprises a phase modulated signal; and
a scaler operable to scale the phase modulation signal by a scaling factor and couple a resulting scaled phase modulation signal to the delay control input of said variable time delay circuit.

2. The modulator apparatus of claim 1 wherein the scaling factor is inversely proportional to the frequency of the oscillatory signal generated by the tunable oscillator circuit.

3. A method of generating an angle modulated signal, comprising:
generating an oscillatory signal;
generating an angle control signal;
generating a scale factor that is dependent on a frequency of the oscillatory signal;
applying the scale factor to the angle control signal to produce a scaled, time varying delay control signal; and
delaying the oscillatory signal in accordance with the scaled, time varying delay control signal to produce an angle modulated signal.

4. The method of claim 3 wherein the oscillatory signal is generated by a tunable oscillator circuit and generating the scale factor comprises generating the frequency dependent scale factor in accordance with a frequency at which the tunable oscillator circuit is tuned.

5. A radio frequency transmitter, comprising:
a baseband circuit operable to generate a polar modulation signal including an envelope modulation signal and a phase modulation signal;
an envelope modulator, configured in an envelope modulation path, operable to generate an envelope modulated power supply signal according to amplitude variations in said envelope modulation signal;
a tunable oscillator circuit having a tuning command input and an output, the tunable oscillator circuit operable to generate a radio frequency carrier signal having a frequency determined by a frequency tuning command applied to the tuning command input;
a variable time delay circuit, configured within a phase modulation path, having a first input configured to receive the radio frequency carrier signal from the tunable oscillator circuit and a delay control input configured to receive said phase modulation signal from said baseband circuit, said variable time delay circuit operable to generate a radio frequency phase modulated signal by variably delaying the radio frequency carrier signal according to time varying changes in phase of said phase modulation signal; and
a radio frequency power amplifier having a radio frequency input configured to receive the radio frequency phase modulated signal from said variable time delay circuit and a power control input configured to receive the envelope modulated power supply signal from said envelope modulator.

6. The radio frequency transmitter of claim 5, further comprising a scaler operable to scale said phase modulation signal before the phase modulation signal is coupled to the delay control input of said variable time delay circuit.

7. The radio frequency transmitter of claim 6 wherein said scaler is operable to scale said phase modulation signal by a scaling factor that is inversely proportional to a frequency of the radio frequency carrier signal.

8. A method of generating a radio frequency communications signal in a polar transmitter, comprising:
generating envelope and phase modulation signals from a digital message;
modulating a power supply signal using said envelope modulation signal to generate an envelope modulated power supply signal;
applying the envelope modulated power supply signal to a power control input of a radio frequency power amplifier;
delaying a radio frequency carrier signal according to time varying changes in phase of said phase modulation signal to generate a radio frequency phase modulated signal; and
amplifying the radio frequency phase modulated signal according to the envelope modulated power supply signal to generate the desired radio frequency communications signal.

9. The method of claim 8, further comprising:
tuning the radio frequency carrier signal to a desired frequency;
scaling the phase modulation signal according to the inverse of the tuned desired frequency to generate a scaled phase modulation signal; and
delaying the radio frequency carrier signal according to time varying changes in phase of the scaled phase modulation signal.

10. An apparatus for generating an angle modulated signal, comprising:
a digital synthesizer operable to generate a stream of digital bits representing a desired operating frequency of an oscillator;
a frequency-locked loop having a controlled oscillator operable to generate a carrier signal at an actual operating frequency based on a frequency control signal, a feedback path with frequency-to-digital converter components configured to convert the actual operating frequency to a stream of digital bits representing the actual operating frequency, and a differencer configured to generate a frequency error signal from a difference between the stream of digital bits representing the desired operating frequency and the stream of digital bits representing the actual operating frequency; and
a variable time delay circuit having a first input configured to receive the carrier signal from the controlled oscillator and a delay control input configured to receive a delay control signal, said variable time delay circuit operable to delay the carrier signal according to the delay control signal to provide the angle modulated signal.

11. The apparatus of claim 10 wherein the delay control signal comprises a signal containing information relating to a desired phase of the angle modulated signal.

12. The apparatus of claim 11 wherein the signal containing information relating to the desired phase of the angle modulated signal comprises a digital signal and said variable time delay circuit comprises a digitally controlled variable time delay circuit.

13. The apparatus of claim 10, further comprising a scaling apparatus operable to scale said delay control signal before it is coupled to the delay control input of said variable time delay circuit.

14. The apparatus of claim 13 wherein the scaling apparatus is operable to scale said delay control signal by a factor relating to the inverse of the desired operating frequency of said controlled oscillator.

15. A method of generating an angle modulated signal, comprising:
   generating a stream of digital bits representing a desired operating frequency of a controlled oscillator;
   generating a stream of digital bits representing an actual operating frequency of the controlled oscillator;
   determining a difference between the streams of digital bits representing the desired operating frequency and the actual operating frequency;
   using said difference to control the actual operating frequency of the controlled oscillator;
   generating a delay control signal containing desired angle modulation information; and
   delaying a carrier signal generated by the controlled oscillator according to the delay control signal to generate a desired angle modulated signal.

16. The method of claim 15 wherein generating the delay control signal comprises:
   generating a stream of digital bits representing a desired phase of the angle modulated signal;
   generating a stream of digital bits representing an actual phase of the angle modulated signal;
   forming a difference between the streams of digital bits representing the desired and actual phases; and
   using the difference to form the delay control signal.

17. The method of claim 16, further comprising:
   scaling said delay control signal; and
   using the resulting scaled delay control signal to control delaying said carrier signal.

18. The method of claim 17 wherein scaling the delay control signal comprises scaling the delay control signal so that it is inversely proportional to an operating frequency of said controlled oscillator.

* * * * *